United States Patent
Erenberger

(10) Patent No.: US 7,091,732 B2
(45) Date of Patent: Aug. 15, 2006

(54) SYSTEMS AND METHODS FOR PROBING PROCESSOR SIGNALS

(75) Inventor: Dennis M. Erenberger, Colorado Springs, CO (US)

(73) Assignee: Agilent Technologies, Inc., Loveland, CO (US)

( * ) Notice: Subject to any disclaimer, the term of this patent is extended or adjusted under 35 U.S.C. 154(b) by 590 days.

(21) Appl. No.: 10/425,237

(22) Filed: Apr. 29, 2003

(65) Prior Publication Data

US 2004/0221199 A1    Nov. 4, 2004

(51) Int. Cl.
*G01R 31/02* (2006.01)
*H01R 12/00* (2006.01)

(52) U.S. Cl. .................................................. 324/755
(58) Field of Classification Search ................. None
See application file for complete search history.

(56) References Cited

U.S. PATENT DOCUMENTS

| | | | |
|---|---|---|---|
| 6,593,763 B1* | 7/2003 | Weber | 324/755 |
| 6,887,109 B1* | 5/2005 | Hofmeister et al. | 324/755 |
| 2002/0011863 A1* | 1/2002 | Takahashi et al. | 324/760 |
| 2003/0122566 A1* | 7/2003 | Takahashi et al. | 324/760 |

* cited by examiner

*Primary Examiner*—Jermele Hollington

(57) ABSTRACT

Signal probing systems are provided. One such signal probing system includes: a socket configured to be electrically coupled to a processor, a printed circuit board (PCB), a separation layer that is located between the socket and the PCB, compensation circuits that each include a resistor and a capacitor coupled in parallel, and an adapter that is attached to the PCB and that is configured to be electrically coupled to a motherboard, wherein the PCB is configured to route respective probed signals through the compensation circuits, the respective probed signals being responsive to respective signals traveling between the processor and the motherboard. Methods and other systems are disclosed.

20 Claims, 5 Drawing Sheets

SYSTEMS AND METHODS FOR PROBING PROCESSOR SIGNALS

BACKGROUND

One way for testing a processor is to connect the processor to a probing device that is then electrically coupled to a logic analyzer. One problem with such a probing device is that it may not be capable of accurately probing processors operating above a certain frequency (e.g., over 1 GHz). Based on the foregoing, it should be understood that there is a need for systems and methods that address this and/or other perceived shortcomings of the prior art.

SUMMARY

An embodiment of a signal probing system includes: a socket configured to be electrically coupled to a processor, a printed circuit board (PCB), a separation layer that is located between the socket and the PCB, compensation circuits that each include a resistor and a capacitor coupled in parallel, and an adapter that is attached to the PCB and that is configured to be electrically coupled to a motherboard, wherein the PCB is configured to route respective probed signals through the compensation circuits, the respective probed signals being responsive to respective signals traveling between the processor and the motherboard.

An embodiment of a method for manufacturing a signal probing system includes: attaching compensation circuits to a PCB, each of the compensation circuits including a resistor and a capacitor coupled in parallel, attaching a separation layer to the printed circuit board (PCB), the separation layer being adjacent to the compensation circuits, attaching a socket to the separation layer, the socket being configured to be electrically coupled to a processor, the socket being attached to the separation layer such that the compensation circuits are located between the socket and the PCB, attaching an adapter to the PCB, the adapter being configured to be electrically coupled to a motherboard, wherein the PCB is configured to respectively route probed signals to the compensation circuits, the probed signal being responsive to respective signals traveling between the processor and the motherboard.

Other systems, methods, features and/or advantages will be or may become apparent to one with skill in the art upon examination of the following figures and detailed description. It is intended that all such additional systems, methods, features, and/or advantages be included within this description and be protected by the accompanying claims.

BRIEF DESCRIPTION OF THE DRAWINGS

In the drawings, like reference numerals designate corresponding parts throughout the several views. Furthermore, the components in the drawings are not drawn to scale.

DETAILED DESCRIPTION

As will be described in more detail, a separation layer of a signal probing system separates a processor socket from a printed circuit board. This separation layer enables compensation circuits to be located closer to probing points located on respective signal paths between a processor and a motherboard. As a result, the signal probing system is capable of more accurately probing higher frequency signals traveling along such signal paths.

Figure 1:
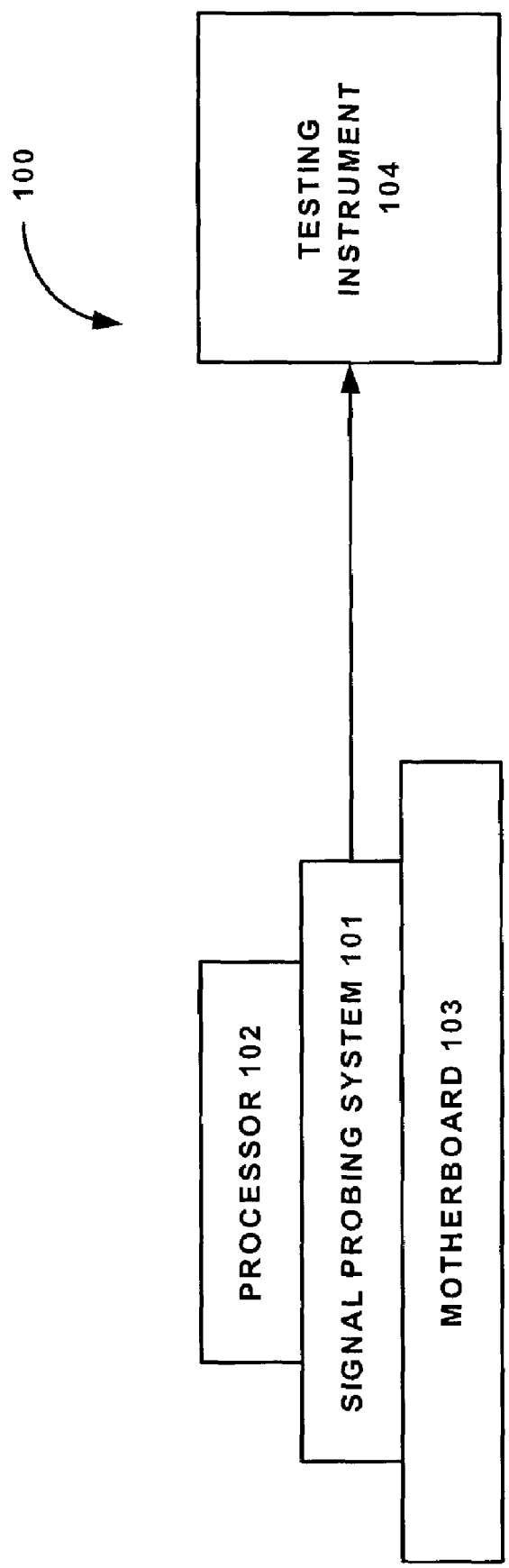
FIG. 1 is a block diagram depicting an embodiment of a processor testing system.

FIG. 1 is a block diagram depicting an embodiment of a processor testing system 100. The processor testing system 100 includes a signal probing system 101 that is coupled between a processor 102 and a motherboard 103. The signal probing system 101 is configured to probe signals that are passed between the processor 102 and the motherboard 103 and to provide the probed signals to a testing instrument 104. The testing instrument 104 is configured to analyze signals received from the signal probing system 101 and to provide signal analysis results to a user. The testing instrument 104 may be, for example, a logic analyzer.

Figure 2:
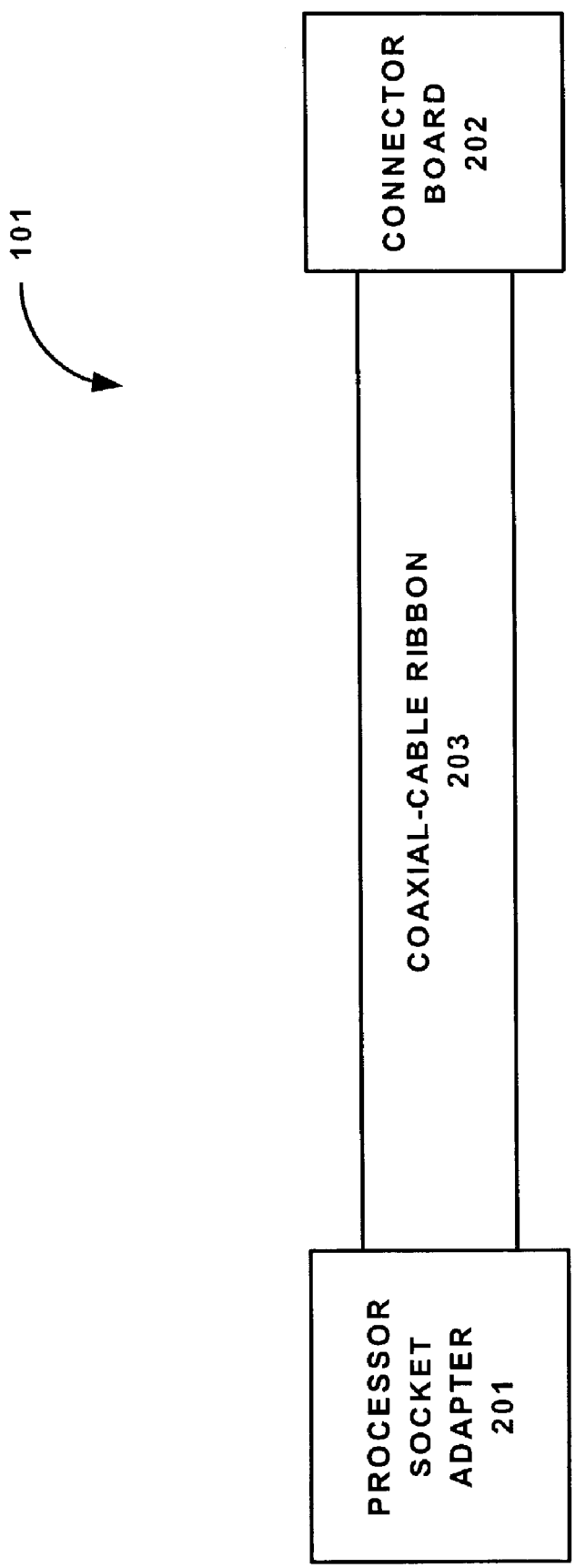
FIG. 2 is a block diagram depicting an embodiment of the signal probing system shown in FIG. 1.

FIG. 2 is a block diagram depicting an embodiment of a signal probing system 101. The signal probing system 101 includes a processor-socket adapter 201, one or more connector boards 202, and one or more coaxial-cable ribbons 203. The processor-socket adapter 201 is configured to be coupled between the processor 102 and the motherboard 103 (FIG. 1). For example, the processor 102 (FIG. 1) may be plugged into the processor-socket adapter 201, which may in turn be plugged into the motherboard 103 (FIG. 1).

The connector board(s) 202 is/are configured to be coupled (directly or indirectly) to the testing instrument 104 (FIG. 1). The coaxial-cable ribbon(s) 203 is/are coupled between the processor-socket adapter 201 and respective connector board(s) 202. When the signal probing system 101 is in operation, the processor-socket adapter 201 probes signals being passed between the processor 102 and the motherboard 103. The coaxial-cable ribbon(s) 203 then conduct the probed signals from the processor-socket adapter 201 to respective connector board(s) 202, which then conducts the signals to the testing instrument 104. Alternatively, the connector board(s) 202 may conduct the signals to a signal conditioning circuit (not shown) that conditions the signals prior to providing them to the testing instrument 104.

Figure 3:
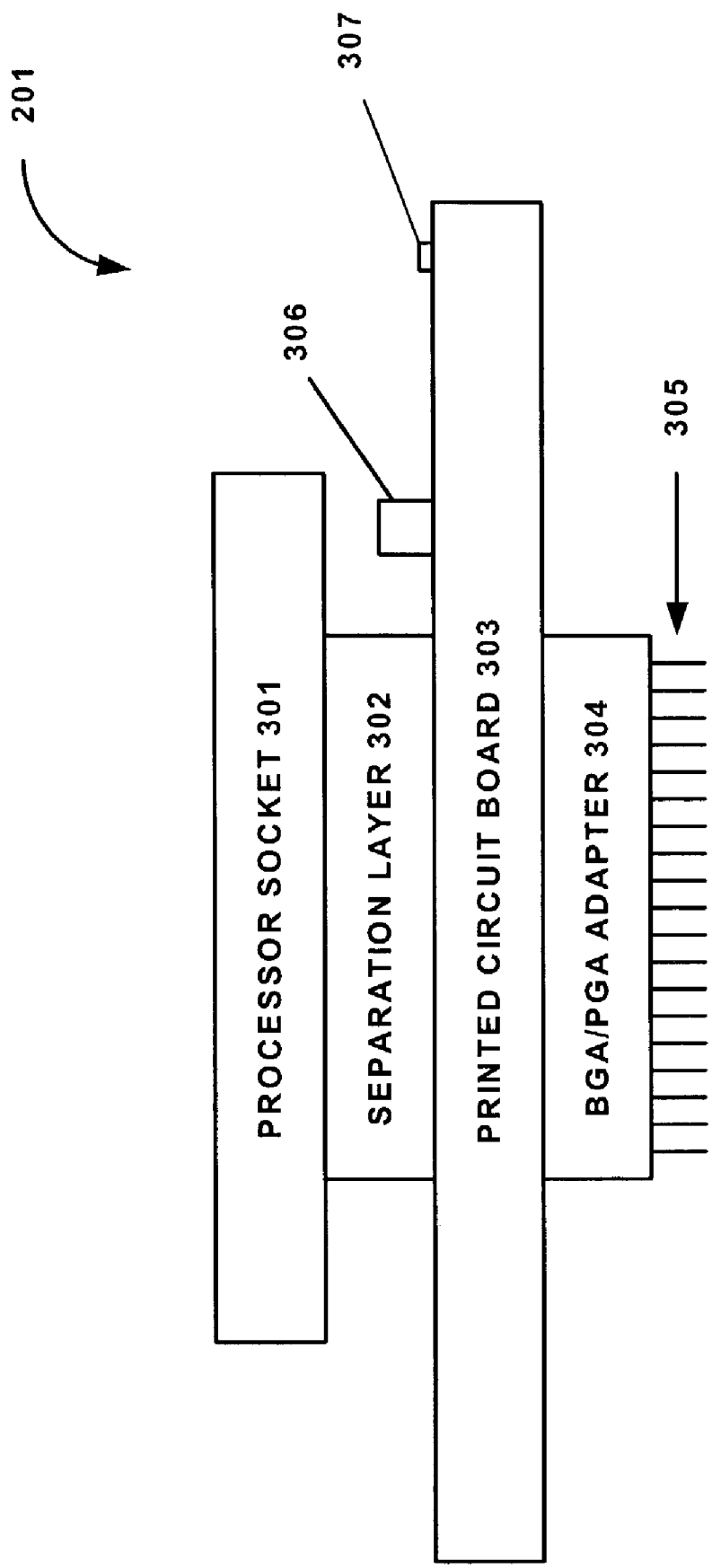
FIG. 3 is a block diagram depicting an embodiment of the processor-socket adapter shown in FIG. 2.

FIG. 3 is a block diagram depicting an embodiment of a processor-socket adapter 201. The processor-socket adapter 201 includes a processor socket 301, a separation layer 302, a printed circuit board (PCB) 303 and a ball-grid-array/pin-grid-array (BGA/PGA) adapter 304. The processor socket 301 is configured to be coupled to a processor 102 (FIG. 1). For example, the pins of the processor 102 may be plugged into respective pin receptacles of the processor socket 301. The BGA/PGA adapter 304 is configured to be plugged into a motherboard via pins 305. The separation layer 302 and the PCB 303 conduct signals between the processor socket 301 and the BGA/PGA adapter 304.

The PCB 303 includes buried resistors (not shown in FIG. 3) that are coupled in series with respective circuits 306 (only one shown). The buried resistors and the respective circuits 306 condition respective signals that are probed by the processor-socket adapter 201. Each compensation circuit 306 may comprise a resistor and a capacitor coupled in parallel. The PCB 303 also includes solder pads 307 (only one shown) that are configured to be soldered to respective coaxial cables corresponding to one or more respective coaxial-cable ribbons 203.

Figure 4:
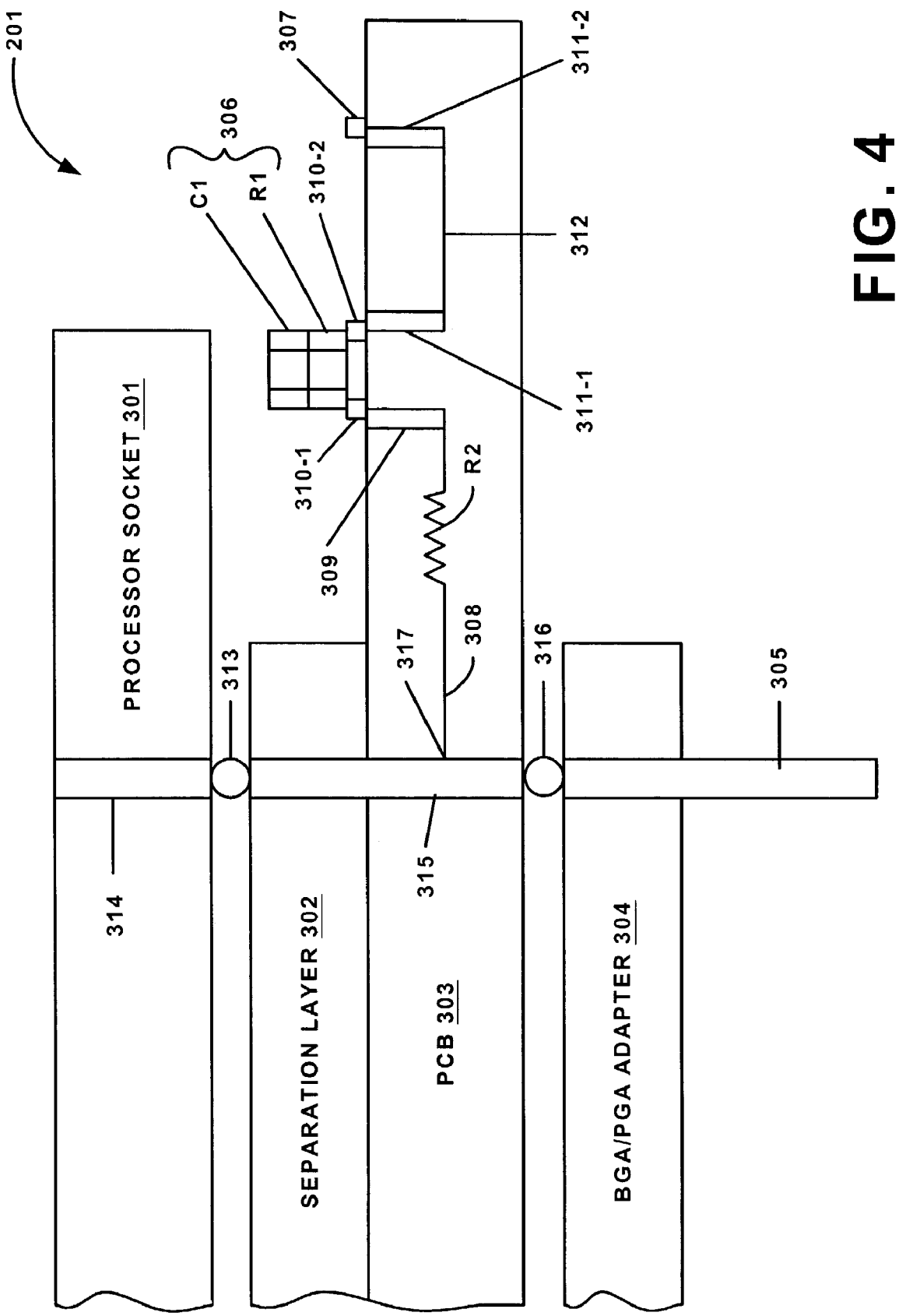
FIG. 4 is a cross-sectional view of a portion of the processor-socket adapter shown in FIG. 3.

FIG. 4 is a cross-sectional view of a portion of a processor-socket adapter 201 depicting one of a plurality of respective signal paths between one of a plurality of pins 305 and one of a plurality of solder pads 307. Similar signal paths exist between other pins 305 and other respective solder pads 307. However, only one of such signal paths is shown in order to provide a clear and simple illustration of an exemplary embodiment.

The processor socket 301 is preferably a zero-insertion-force (ZIF) socket, and the pin receptacle 314 is preferably a ZIF pin receptacle. The processor socket 301 is attached to the separation layer 302 via BGA solder balls 313 (only one ball 313 is shown). The separation layer 302 is attached to the PCB 303 via, for example, a lamination process. The PCB 303 is attached to the BGA/PGA adapter 304 using BGA solder balls 316 (only one ball 316 is shown).

A conductor-plated via 315 is formed within the separation layer 302 and the PCB 303. The conductor-plated via 315 may be formed by drilling a via into the separation layer 302 and the PCB 303, plating the via with a conductor (e.g., copper), filling the plated via with an epoxy material, and then sealing the via at both ends with a conductor pad (e.g., comprising gold).

A signal may travel between the processor 102 (FIG. 1) and the motherboard 103 (FIG. 1) by being conducted through the pin 305, the BGA solder ball 316, the conductor-plated via 315, the BGA solder ball 313, and the pin receptacle 314 (in either direction). Such a signal is probed by a conductive trace 308 that is coupled in series with a resistor R2 and a compensation circuit 306.

The separation layer 302 enables a compensation circuit 306 to be located closer to a probing point 317 located on a signal path between the processor 102 and the motherboard 103. Locating the compensation circuit 306 closer to the probing point 317 increases the operating bandwidth of the signal probing system 101 (i.e., enables the signal probing system 101 (FIG. 1) to accurately probe signals having higher frequencies). Furthermore, locating the compensation circuit 306 closer to the probing point 317 reduces circuit loading, which in turn reduces the attenuation of signals being probed by the signal probing system 101.

Certain motherboards may have one or more components that are in such close proximity to a processor that conventional processor-socket adapters may not be successfully coupled to the motherboards for the purpose of testing such processor. Locating compensation circuits 306 closer to respective probing points 317 allows the size of the PCB 303 to be reduced. This prevents the PCB 303 from colliding with components of a motherboard 103 that surround the designated location of a processor 102 as a user attempts to couple the PCB 303 to such designated location. As a result, the processor-socket adapter 201 may be used in conjunction with a wider variety of motherboards 103.

The compensation circuit 306 comprises a capacitor C1 and a resistor R1 coupled in parallel. The resistor R2 may be coupled to the compensation circuit 306 circuit through a conductor-plated via 309 and a solder pad 310-1. The compensation circuit 306 circuit may be coupled to the solder pad 307 through a solder pad 310-2, conductor-plated vias 311-1 and 311-2, and a conducting trace 312.

Figure 5:
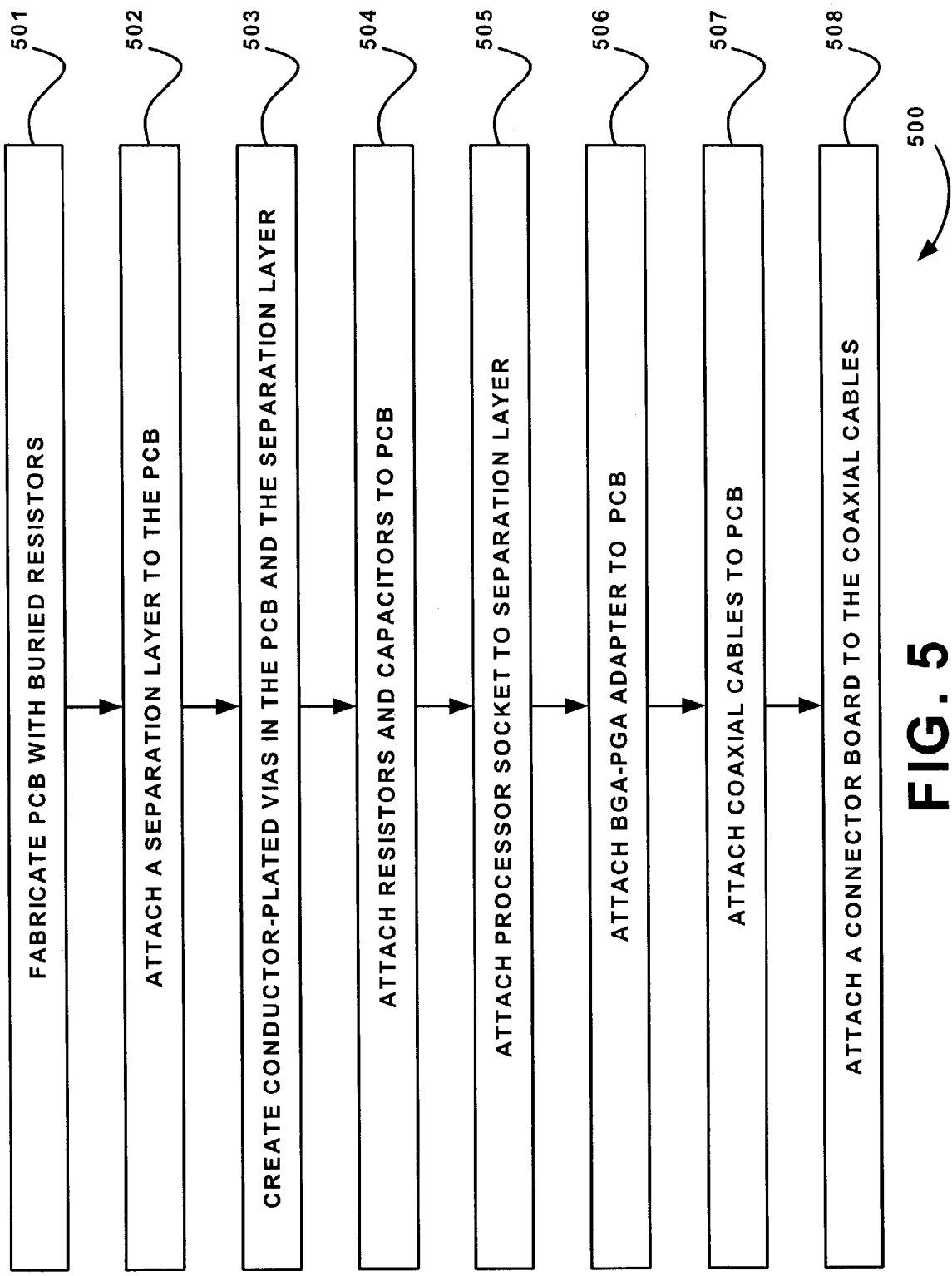
FIG. 5 is a flow chart depicting an embodiment of a method for manufacturing a signal probing system.

FIG. 5 is a flow chart depicting an embodiment of a method 500 for manufacturing a signal probing system 101. The method 500 will be discussed with additional reference to components depicted in FIGS. 1–4. A PCB 303 (FIG. 3) is fabricated with buried resistors R2 (FIG. 4), as indicated in block 501. Alternatively, surface-mounted or etched resistors may be used instead of the buried resistors R2. The PCB 303 may also be fabricated to include conductor-plated vias 309, 311-1 and 311-2, solder pads 307, 310-1, and 310-2, conductor-plated vias, conducting traces 312 (FIG. 4).

A separation layer 302 (FIG. 3) is attached to the PCB 303, as indicated in block 502. The separation layer 302 may comprise, for example, fiber-glass (or some other dielectric), and may be attached to the PCB 303 using, for example, a lamination process. Conductor-plated vias 315 (FIG. 4) extending through the separation layer 302 and the PCB 303 are created, as indicated in block 503. Each conductor-plated via 315 is coupled to a respective buried resistor R2.

Resistors R1 and capacitors C1 (FIG. 4) are attached the PCB 303, as indicated in block 504. Each resistor R1 is coupled in parallel to a respective capacitor C1 and in series with a respective resistor R2 and with a respective solder pad 307.

A processor socket 301 is attached to a separation layer 302, and a BGA-PGA adapter 304 is attached to the PCB 303, as indicated in blocks 505 and 506, respectively. The steps depicted in blocks 505 and 506 may be performed using, for example, BGA solder balls. The processor socket 301 is configured to receive processor pins corresponding to a processor 102 (FIG. 1). The BGA-PGA adapter 304, on the other hand, is configured to be plugged into a motherboard 103 (FIG. 1).

One or more coaxial cable ribbons (FIG. 2) are attached to the PCB 303 through the solder pads 307, as indicated in block 507. The coaxial cable ribbon(s) 203 preferably comprise micro-coaxial cables that are much thinner than those used, for example, to provide input to a television set. One or more connector boards 202 (FIG. 2) is/are attached to respective coaxial cable ribbon(s), as indicated in block 508. The connector board(s) 202 is/are configured to be coupled (directly or indirectly) to a testing instrument 104.

Note that some of the steps depicted in FIG. 5 may be performed in an order that is different than the illustrated order, including concurrently or in reverse order. For example, any of the steps depicted in blocks 505, 506, 507, and/or 508 may be performed before or after any of the other steps depicted in such blocks.

It should be emphasized that the above-described embodiments are merely possible examples, among others, of the implementations. Many variations and modifications may be made to the above-described embodiments. All such modifications and variations are intended to be included herein within the scope of the disclosure and protected by the following claims.

What I claim is:

1. A signal probing system comprising:
a socket configured to be electrically coupled to a processor;
a printed circuit board (PCB);
a separation layer that is located between the socket and the PCB;
compensation circuits that each include a resistor and a capacitor coupled in parallel, the compensation circuits being attached to the PCB, being located between the socket and the PCB, and being adjacent to the separation layer; and
an adapter that is attached to the PCB and that is configured to be electrically coupled to a motherboard;
wherein the PCB is configured to route respective probed signals through the compensation circuits, the respective probed signals being responsive to respective signals traveling between the processor and the motherboard.

2. The system of claim 1, further comprising:
damping resistors that are respectively coupled in series with the compensation circuits.

3. The system of claim 1, wherein the damping resistors are embedded in the PCB.

4. The system of claim 3, further comprising:
coaxial cables that are attached to the PCB; and
at least one connector board that is attached to the coaxial cables, the connector board configured to be electrically coupled to a logic analyzer.

5. The system of claim 1, wherein the separation layer is laminated to the PCB.

6. The system of claim 1, wherein respective arrays of BGA solder balls are used to attach the socket to the separation layer, and to attach the PCB to the adapter.

7. The system of claim 1, wherein the compensation circuits are soldered to the PCB.

8. The system of claim 1, wherein the separation layer enables the compensation circuits to be located between the socket and the PCB.

9. The system of claim 1, wherein the socket is configured to enable processor pins to be plugged into the socket.

10. The system of claim 1, wherein the adapter includes pins that are configured to be plugged into the motherboard.

11. A method for manufacturing a signal probing system, the method comprising the steps of:
attaching compensation circuits to a PCB, each of the compensation circuits including a resistor and a capacitor coupled in parallel;
attaching a separation layer to the printed circuit board (PCB), the separation layer being adjacent to the compensation circuits, and being configured to enable the compensation circuits to be located between the PCB and a socket;
attaching the socket to the separation layer, the socket being configured to be electrically coupled to a processor, the socket being attached to the separation layer such that the compensation circuits are located between the socket and the PCB;
attaching an adapter to the PCB, the adapter being configured to be electrically coupled to a motherboard;
wherein the PCB is configured to respectively route probed signals to the compensation circuits, the probed signal being responsive to respective signals traveling between the processor and the motherboard.

12. The method of claim 11, further comprising:
fabricating the PCB to include damping resistors that are embedded in the PCB.

13. The method of claim 11, further comprising:
creating holes that extend through the separation layer and the PCB; and
inserting a conductive material into the holes such that the conductive material in each hole is electrically coupled to a respective damping resistor.

14. The method of claim 11, further comprising:
attaching coaxial cables to the PCB.

15. The method of claim 14, further comprising:
attaching a connector board to the coaxial cables, the connector board configured to be electrically coupled to a logic analyzer.

16. The method of claim 11, wherein respective arrays of BGA solder balls are used to attach the socket to the separation layer, and to attach the PCB to the adapter.

17. The method of claim 11, wherein the compensation circuits are soldered to the PCB.

18. The method of claim 11, wherein the separation layer enables the compensation circuits to be located between the socket and the PCB.

19. The method of claim 11; wherein the socket is configured to enable processor pins to be plugged into the socket.

20. A signal probing system comprising:
a socket configured to be electrically coupled to a processor;
a printed circuit board (PCB);
compensation circuits that each include a resistor and a capacitor coupled in parallel, the compensation circuits being attached to the PCB,
means for keeping the socket separated from the PCB to enable the compensation circuits to be located between the socket and the PCB; and
means for electrically coupling the signal probing system to a motherboard;
wherein the PCB is configured to route respective probed signals through the compensation circuits, the respective probed signals being responsive to respective signals traveling between the processor and the motherboard.

* * * * *

UNITED STATES PATENT AND TRADEMARK OFFICE
CERTIFICATE OF CORRECTION

PATENT NO. : 7,091,732 B2  Page 1 of 1
APPLICATION NO. : 10/425237
DATED : August 15, 2006
INVENTOR(S) : Erenberger It is certified that error appears in the above-identified patent and that said Letters Patent is hereby corrected as shown below:

On the title page, in item (56), under "U.S. Patent Documents", in column 2, line 1, delete "B1" and insert -- B2 --, therefor.

On the title page, in item (56), under "U.S. Patent Documents", in column 2, line 2, delete "B1" and insert -- B2 --, therefor.

Column 6, line 24, in Claim 19, delete "11;" and insert -- 11, --, therefor.

Signed and Sealed this

Ninth Day of January, 2007

JON W. DUDAS
*Director of the United States Patent and Trademark Office*